US012725952B2

(12) United States Patent
Taylor et al.

(10) Patent No.: US 12,725,952 B2
(45) Date of Patent: Sep. 1, 2026

(54) COMPLIANT PRESSURE LID FOR PROCESSOR SOCKET HARDWARE

(71) Applicant: Amphenol Corporation, Wallingford, CT (US)

(72) Inventors: Paul R. Taylor, Mechanicsburg, PA (US); Rodney Grove, York, PA (US)

(73) Assignee: Amphenol Corporation, Wallingford, CT (US)

( * ) Notice: Subject to any disclaimer, the term of this patent is extended or adjusted under 35 U.S.C. 154(b) by 405 days.

(21) Appl. No.: 18/341,534

(22) Filed: Jun. 26, 2023

(65) Prior Publication Data

US 2024/0022011 A1 Jan. 18, 2024

Related U.S. Application Data

(60) Provisional application No. 63/389,256, filed on Jul. 14, 2022.

(51) Int. Cl.

*H01R 12/85* (2011.01)
*G06F 1/20* (2006.01)
*H05K 7/20* (2006.01)

(52) U.S. Cl.

CPC ............... *H01R 12/85* (2013.01); *G06F 1/20* (2013.01); *H05K 7/2039* (2013.01)

(58) Field of Classification Search

CPC ........... H01R 12/85; H01R 12/88; G06F 1/20; H05K 7/2039; H05K 7/1053; H05K 7/1061; H05K 7/1069; Y10S 439/91

USPC ............................................ 439/59, 71, 260

See application file for complete search history.

(56) References Cited

U.S. PATENT DOCUMENTS 4,460,223 A * 7/1984 Brown ................. H05K 7/1061 439/95
4,498,721 A * 2/1985 van Dijk .............. H05K 7/1061 439/59
5,344,334 A * 9/1994 Laub .................... H05K 7/1061 439/73

(Continued)

OTHER PUBLICATIONS

Helen, [New Update] Intel and AMD CPU Socket Types with Diagram. MiniTool Partition Wizard. Jul. 6, 2023. https://www/partitionwizard.com/paritionmagic/cpu-socket-types.html [last accessed Sep. 20, 2023], 5 pages.

*Primary Examiner* — Renee S Luebke
*Assistant Examiner* — Paul D Baillargeon
(74) *Attorney, Agent, or Firm* — Wolf, Greenfield & Sacks, P.C.

(57) ABSTRACT

Compliant lids for processor socket assemblies are described. The compliant lids described herein ensure uniform compression across the contact field notwithstanding the recent trend to continue to increase the physical dimension of the socket and the density of contacts. Compression uniformity can be enhanced by relocating the pressure exerted on the package away from the corners of the package. This can be accomplished by designing the compliant lids to have openings shaped to interrupt the continuous material that would otherwise extend from the corner of the lid to the region where the lid engages the processor. This void of material is shaped so that continual presence of material exists primarily in the region where the force delivery is preferred. Use of such compliant lids can enhance compression uniformity without having to rely on complex curved plates and stepped insulators.

25 Claims, 6 Drawing Sheets

(56) References Cited

U.S. PATENT DOCUMENTS

| | | | | |
|---|---|---|---|---|
| 7,497,717 | B2 * | 3/2009 | Zhang | H05K 7/1053 439/73 |
| 8,303,332 | B2 * | 11/2012 | Wertz | H01R 12/73 439/485 |
| 11,404,811 | B2 | 8/2022 | Do et al. | |

* cited by examiner

PRIOR ART

PRIOR ART

COMPLIANT PRESSURE LID FOR PROCESSOR SOCKET HARDWARE

RELATED APPLICATIONS

This application claims the benefit under 35 U.S.C. § 119(e) of U.S. Provisional Application Ser. No. 63/389,256, filed on Jul. 14, 2022, and entitled "COMPLIANT PRESSURE LID FOR PROCESSOR SOCKET HARDWARE," which is hereby incorporated herein by reference in its entirety.

BACKGROUND

This patent application relates to socket assemblies. A socket is a connector to connect a component, such as an integrated circuit (IC), to a substrate, such as a printed circuit board (PCB). Sockets provide separable connections such that the component may be added or removed from an electronic device using sockets.

Sockets are frequently used to connect a processor to a motherboard of a computer. Processors that are connected to motherboards using sockets do not require soldering. As a result, a processor can be easily replaced by a user. Accordingly, a processor socket, sometimes referred to as a CPU socket, is used as an example herein.

A socket may be used as part of a socket assembly. The socket assembly may include, in addition to the socket, hardware components that provide force on the component to ensure that connection points on the component make reliable contact with contacts within the socket. Some processor socket assemblies may also include a lock to prevent motion of the processor and to secure a heat sink above the processor.

Sockets may support connections to components with varying types of connection points and may be connected to a substrate in varying ways. For example, some modern CPU sockets use a pin grid array (PGA) for connection to a motherboard and accept processors with PGA packaging. PGA packaging is used in many integrated circuits (IC), as it provides multiple pins for making signal connections. In a PGA package, an array of pins extends from the underside of the package. The pins may be closely spaced, such as with pins separated by dimension on the order of 0.1 mm. When the package is placed on a motherboard, the pins may be soldered to pads or within holes on the surface of the motherboard, making many connections between the package and motherboard in a small area.

A processor with a PGA package could be soldered to the PCB, but may instead be connected to the motherboard through a socket, and the socket may be connected to the motherboard via a PGA. In this case, a PGA may extend through from underside of the socket. Within the socket, the pins may be connected to compliant contacts such that when the processor is pressed into the socket, pins from the processor may be connected to the pins of the socket, making multiple connections between the processor and the motherboard.

Sockets may receive processors with other types of packaging. Some chips with high numbers of pin-outs may use land grid array (LGA). With LGA packaging, the connection points are provided as an array of pads on a surface of the component. For an LGA socket, the contacts within the socket may be compliant springs that make contact with the pads with the processor is pressed into the socket.

The same type of packaging technology may be used to connect the socket to the motherboard as is used to connect the processor to the socket. For example, a socket may have contacts that are compliant at both ends such that, when the processor is pressed into an array of contacts on one side of the socket, the compliant contacts on the opposite side of the socket are pressed into the motherboard. However, it is not a requirement that the packaging technology used for connecting the socket to the PCB match the packaging technology used to connect the processor to the socket. Contacts in the socket, for example, may be soldered to the PCB, for example.

Regardless of the specific packaging technology used, connection of a processor to a motherboard through a socket conventionally requires a downward force be applied to the processor. That force is usually applied via the hardware components of the socket assembly.

SUMMARY

Some embodiments relate to a processor socket assembly, comprising: a complaint lid configured to press a processor against a socket along a vertical direction, wherein the lid comprises: first, second, third and fourth segments surrounding a central opening so that the first segment is opposite the third segment and the second segment is opposite the fourth segment, wherein the central opening is configured to expose at least a portion of the processor; and a first opening defined through a first portion of the first segment and a first portion of the second segment.

In some embodiments, the lid further comprises a second opening defined through a second portion of the second segment and a first portion of the third segment; a third opening defined through a second portion of the third segment and a first portion of the fourth segment; and a fourth opening defined through a second portion of the fourth segment and a second portion of the first segment.

In some embodiments, the compliant lid comprises a top surface and a bottom surface opposite the top surface, wherein the bottom surface of the compliant lid is configured to apply force on the processor at the first, second, third and fourth segments along the vertical direction when the complaint lid is compressed from the top surface.

In some embodiments, the first, second, third and fourth segments are compliant with respect to the vertical direction.

In some embodiments, the first opening is L-shaped.

In some embodiments, wherein the first segment joins a first corner of the compliant lid to a second corner of the compliant lid, the second segment joins the first corner of the compliant lid to a third corner of the compliant lid, the second and third corners being diagonally opposite to each other, and the first opening is adjacent to the first corner and has a first region extending towards the second corner and a second region extending towards the third corner.

In some embodiments, the complaint lid further comprises a fastener opening in a region where the first segment joins the second segment, the fastener opening being shaped to permit passage of a fastener therethrough.

In some embodiments, the first segment defines an inner portion proximal the central opening, an outer portion distal the central opening, and a bridge portion joining the inner portion to the outer portion.

In some embodiments, the inner portion has a first thickness with respect to the vertical direction, and the outer portion has a second thickness with respect to the vertical direction, wherein the second thickness is larger than the first thickness.

In some embodiments, the bridge portion has a sloped surface facing the processor when the lid presses the processor against the socket.

In some embodiments, the lid further comprises a lip extending towards the processor when the lid presses the processor against the socket.

In some embodiments, the lip surrounds the central opening.

Some embodiments relate to a processor socket assembly, comprising a complaint lid configured to press a processor against a socket along a vertical direction, wherein the lid comprises: a top surface and a bottom surface opposite the top surface; first, second, third and fourth segments surrounding a central opening so that the first segment is opposite the third segment and the second segment is opposite the fourth segment, wherein the central opening is configured to expose at least a portion of the processor and wherein the first segment joins a first corner of the compliant lid to a second corner of the compliant lid; and means for applying more force at a midpoint of the first segments than at the first corner when force is applied on the top surface of the compliant lid.

In some embodiments, the means comprises a first opening defined through a first portion of the first segment.

In some embodiments, the first opening is further defined through a first portion of the second segment.

In some embodiments, the means further comprises a second opening defined through a second portion of the second segment.

In some embodiments, the second opening is further defined through a first portion of the third segment.

In some embodiments, the means further comprises a third opening defined through a second portion of the third segment and a first portion of the fourth segment, and a fourth opening defined through a second portion of the fourth segment and a second portion of the first segment.

In some embodiments, the complaint lid further comprises a fastener opening defined in the first corner, the fastener opening being shaped to permit passage of a fastener therethrough.

Some embodiments relate to a method for engaging a processor to a socket using a compliant lid comprising top and bottom surfaces, first, second, third and fourth corners, and first, second, third and fourth segments surrounding a central opening, the first segment joining the first corner to the second corner, the second segment joining the second corner to the third corner, the third segment joining the third corner to the fourth corner and the fourth segment joining the fourth corner to the first corner, the method comprising: placing the processor on the socket; placing the compliant lid on the processor so that: the processor is sandwiched between the socket and the compliant lid, the bottom surface of the compliant lid faces the processor, and the top surface of the compliant lid faces away from the processor; causing the bottom surface of the compliant lid to compress the processor so that force applied at a midpoint of the first segments is larger than force applied at the first corner, wherein causing the bottom surface of the complaint lid to compress the processor comprises applying force on the top surface of the compliant lid.

In some embodiments, the force applied at the midpoint of the first segments is larger than the force applied at the first corner by at least 75%.

In some embodiments, the force applied at the midpoint of the first segments is at least twice the force applied at the first corner.

In some embodiments, applying force on the top surface of the compliant lid comprises pressing a heat sink on the top surface of the compliant lid.

In some embodiments, the method further comprises securing the compliant lid to a printed circuit board (PCB) on which the socket is mounted using a plurality of fasteners.

In some embodiments, securing the compliant lid to the PCB comprises engaging the fasteners with the first, second, third and fourth corners of the compliant lid.

Some embodiments relate to a processor socket assembly, comprising a complaint lid configured to press a processor against a socket along a vertical direction, wherein the lid comprises: a central opening configured to expose at least a portion of the processor;

an inner portion enclosing the central opening; and an outer portion enclosing the inner portion, wherein an opening defined in the lid separates part of the outer portion from part of the inner portion, wherein the part of the outer portion is thicker than the part of the inner portion with respect to the vertical direction.

In some embodiments, the lid further comprises a bridge portion joining the outer portion to the inner portion, the bridge portion comprising a sloped surface.

In some embodiments, the sloped surface is defined in the bottom surface of the lid.

In some embodiments, the opening is L-shaped.

In some embodiments, the lid further comprises a lip extending towards the processor when the lid presses the processor against the socket.

In some embodiments, the lip surrounds the central opening.

Some embodiments relate to a processor socket assembly, comprising: a complaint lid configured to press a processor against a socket along a vertical direction, wherein the lid comprises: a top surface and a bottom surface opposite the top surface, the bottom surface facing the processor when the processor socket assembly is assembled; a central opening configured to expose at least a portion of the processor; and a lip adjacent the central opening and extending towards the processor from the bottom surface when the processor socket assembly is assembled.

In some embodiments, the lip surrounds the central opening.

In some embodiments, the lip has a constant height.

In some embodiments, the lip is continual.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DESCRIPTION OF PREFERRED EMBODIMENTS

Figure 1A:
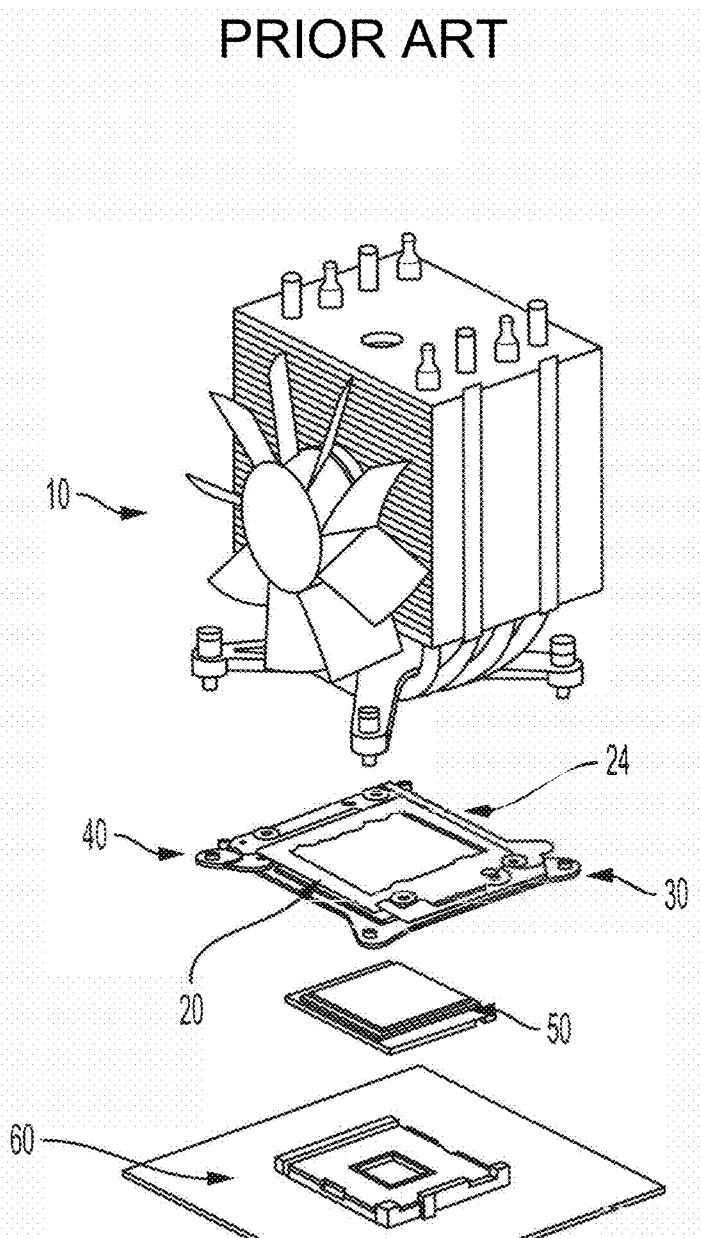
FIG. 1A is an exploded perspective view of a conventional processor socket assembly.

The inventors have recognized appreciated designs for socket assemblies that provide reliable connection between large chips and a PCB in a compact space that supports miniaturized electronics. Such socket assemblies include compliant lids that provide uniform compression across the contact field notwithstanding the multiple electrical and mechanical constraints arising from the ever-increasing size of ICs, such as processors, and density of contacts to be connected through a socket.

Traditional processor socket assemblies combine rigid structural components with separate compliant spring components to compress a processor chip into a socket connector. Depending on the design requirements, force may be delivered to the processor chip through a pressure plate (e.g., a clamshell lid), a heatsink, or a combination of both. In recent years, there has been a continuous increase in the physical size of ICs, such as processors, and therefore sockets for such components, without a corresponding increase in available space, both in terms of surface area of a printed circuit board occupied by the socket assembly and the height above the board.

Further, proper operation of the socket requires that each socket contact be compressed by an amount within its electrical compliance range. This requirement may be met by hardware components of the socket assembly that press an IC into the socket so as to create compression across the entire contact field that is within the electrical compliance range of all the contacts. Ensuring that compression is uniformly within the electrical compliance range has become more challenging based on trends in the electronic industry. Recent processors have an increasing density of contacts, both in terms of contacts per unit of length and contacts per unit of width. The increased density requires that each socket contact be smaller, and that each contact deliver less force so that boards and supporting hardware do not deflect beyond the point where they can damage. As a contact becomes smaller, it generally decreases in electrical compliance range, making it more difficult to design socket hardware to provide compression uniformly within the electrical compliance range across the contact field of the socket.

Conventionally, maintaining a uniform compression across the contact field in a socket has been achieved through adding curvature to the plates to counter bowing of the board away from the connector, or using stepped insulators to keep the board flat despite bolster deflection out of flatness. However, these features render manufacturing and assembly processes more complex, thus increasing costs.

A further challenge is that the hardware components of a socket assembly must be compatible with the electrical requirements of the PCB to which it is mounted. For example, screws are often used to attach a top plate to the bottom plate of a processor socket assembly. The preferred location for these screws is at the diagonal corners of the plates because forming holes through the motherboard at those locations is least likely to interfere with traces within the PCB being routed away from the contact field.

The inventors have recognized and appreciated socket assembly hardware components that, notwithstanding these constraints and requirements, deliver desirable electrical and mechanical performance. The hardware components may include a compliant lid that may provide the required amount of force. This force may be generated without the use of separate spring components, thus enabling miniaturization of the electronic devices using these socket assemblies. The complaint lid may include features that promote uniformity of force across the entire contact field, even for large sockets, such as those receiving large processor chips. The compliant nature of the lid may ensure that each contact receives a force no less that the minimum force required to form a reliable electric contact despite the fact that the various components of a processor socket assembly inevitably exhibit some degree of thickness variation, which may arise as a result of manufacturing tolerances.

Additionally, a socket assembly with a compliant lid may be implemented so as to be compatible with electrical requirements of a PCB to which the socket assembly is mounted. The inventors have recognized and appreciated that, though the design of the PCB is simplified by mounting holes in the diagonal corners of the socket assembly, a preferable force distribution may be achieved by applying force as close as possible to the middle of the processor. As described below, a compliant lid may include an outer portion with attachment locations in the corners. An inner portion that may press against an IC, such as a processor, in the socket. Linkages from the outer portion to the inner portion may couple force to locations on the inner portion away from corner locations such that force is applied to the processor closer to its central portion. The inventors theorize that, by applying force closer to the middle of the processor, the uniformity with which the processor contacts engage with the socket contacts is improved. The compliant lids as described herein may be configured to move the region where force is applied away from the corners of the processor and closer to the center of the processor while, at least in some embodiments, keeping the location of mounting screws near to the corners. Such compliant lids can enhance compression uniformity without having to rely on complex curved plates and stepped insulators, as have been used in conventional socket designs.

The compliant lids as described herein may, instead of or in addition to being designed to provide uniform compression across the contact field, be designed to produce an additional seating force, which ensures robust service operation. The compliant lids described herein may prevent overstress that may otherwise arise when the aggregate effects of the tolerance of the assembly components leads to the highest amount of spring force.

Compliant lids in accordance with some embodiments comprise openings shaped to interrupt the continuous material that would otherwise extend from the corner of the lid to the region where the lid engages the processor. This void of material is shaped so that continual presence of material exists primarily in the region where the force delivery is preferred. This arrangement increases the separation between the screws and the regions where contact occurs, thereby allowing the lid to be more compliant in the region of interest and to behave as a spring in the vertical direction. These openings may further expose the diagonal corners of the package device, thereby reducing the amount of compression exerted at the corners.

Thus, lids including openings of these types increase the vertical compliance of the lid and move the force applied to the package away from the corners. This results in a significant improvement in the uniformity of compression across the contact field. Additionally, the openings lead to a reduction in the weight of the lid, making the lid easier to handle.

In some embodiments, compliant lids of the types described herein have thick outer portions. For example, the outer portions of the lid may be thicker than the inner portions. The inventors have appreciated that increasing the thickness of the outer portions increases the force delivered to the package to the level necessary to compress the array of contacts. At the same time, the region above the processor remains thin, thus providing proper compliance. Alternatively, or additionally, the increased thickness at the outer portions of the lid may act as a mechanical stop, controlling the limit of fastening and providing repeatable seating, while nonetheless enabling sufficient compliance of the inner portion to compensate for variations associated with deflection or manufacturing tolerances. The high stiffness of the lid at the outer portions may also maintain a load on the fastening screws, so that the screws do not become loose over time. Force maintenance may be important because screws are relatively short and as a result do not tend to stretch significantly. The supplemental thickness around the outer portions of the lid relative to the inner portion can be produced using various manufacturing methods. For example, the lid may be a stamped, laser, or water jet cut blank, formed with a sheet metal bend at each edge, remain as a thicker region of a cast or machined block, or as a secondarily welded piece.

In some embodiments, compliant lids of the types described herein comprise a raised portion on a lower surface of the inner portion of the compliant lid. The raised portion may extend beyond the lower surface and contact a processor in the socket. Force may be coupled to the processor preferentially at the location or locations of the raise portion. This raised portion may be positioned to contact a central region of a processor in the socket, which may provide for more uniform force distribution across the contact field of the socket.

In some examples, the inner portion of the compliant lid may have an opening in the central region such as to enable a heat sink to be coupled to the processor. In such a configuration, the raised portion may be configured as a lip around the opening and may apply force away from the edge of the package lid if doing so is desirable to balance force distribution. The lip may be formed as a raised portion of material located on the underside of the complaint lid. The raised portion may be positioned such that little or no force is applied through the outer edge of the lid. The lip, for example, may be at or near the edge of a central opening in the inner portion of the compliant lid. Such an opening may enable a heatsink pedestal to engage the package through the compliant lid.

The lip or other raised portion may have a constant or variable height beyond that of the adjacent surface. The width and height of the lip, for example, may vary across the inner portion such that the pressure distribution across the lid may be tailored for a specific application. The lip may be continual around the entire central opening, or there may be multiple independent lips positioned around the central opening.

A lip may be produced with various manufacturing methods. For example, it could be formed as a continuation of the body of the lid using a sheet metal coin, remaining as a thicker region of a cast or machined block. As a separate incompressible material, it could be added to the lid as a bonded/adhered sheet, a clip-in attachment, or a thinner sheet metal component. Alternately, there could be raised features on the processor lid which relocate the lip from one component to another.

FIG. 1A is an exploded perspective view of a conventional processor socket assembly. This socket assembly includes a printed circuit board (PCB) 70 (e.g., a motherboard), a socket 60 mounted on PCB 70, a processor 50 pressed onto socket 60, top plate 30 and bottom plate 80 positioned on opposite sides of PCB 70, and heat sink 10. Fasteners (e.g., screws) 40 are positioned at the four corners of top plate 30, and engage the top plate with the bottom plate 80, with the PCB 70 between them, thereby securing the top plate to the PCB. A retention device 20 and a lever 24 are connected to top plate 30. Lever 24 actuates retention device 20. Assembling the package involves the following steps. First, socket 60 is attached to PCB 70. Then, top plate 30 is fastened to PCB 70 with socket 60 disposed between them. Then, processor 50 is laid on top of socket 60 through the opening of top plate 30 with retention device 20 in the disengaged position. Then, lever 24 is pulled down so as to cause retention device 20 to press processor 50 into socket 60. As a result, the pins of the processor are pressed into engagement with pin holes in the socket (in PGA configurations) or the pads of the processor are pressed into engagement with pins of the socket (in LGA configurations). Lastly, heat sink 10 is placed in thermal contact with processor 50 through the opening of top plate 30. Thermal contact may involve direct physical contact or contact through a thermal interface material (TIM).

Figure 1B:
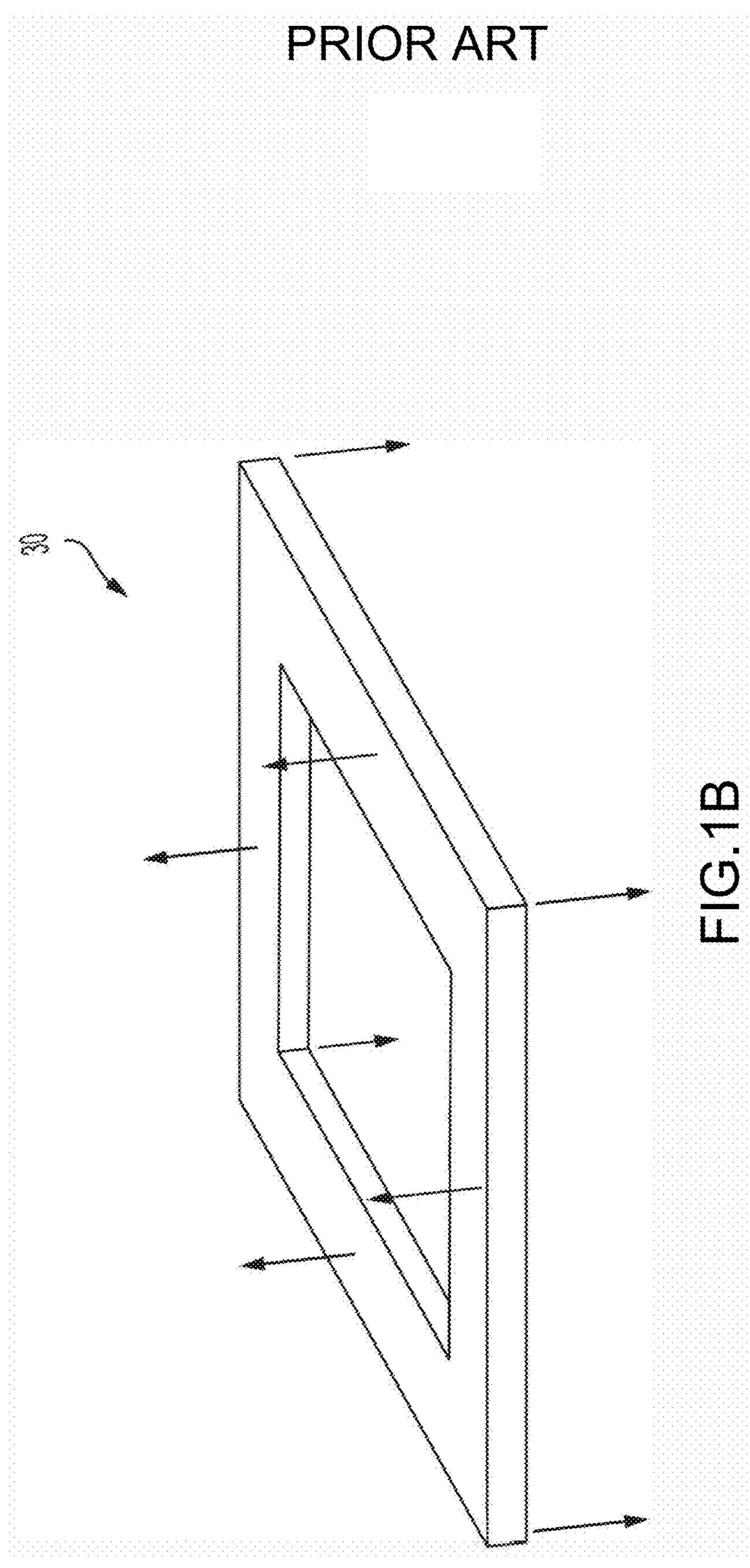
FIG. 1B is a perspective view showing a schematic representation of the top plate of the conventional processor socket assembly of FIG. 1A.

FIG. 1B is a perspective view showing a schematic representation of the top plate 30 of the processor socket assembly of FIG. 1A. This figure shows where the top plate exerts force towards the processor when the package is assembled. As shown, force is exerted predominantly in the regions near the four corners of top plate 30, which corresponds to locations near the corners of the processor. This is because, in the interest of forming holes through the motherboard at locations that are least likely to interfere with routed circuits, fasteners 40 are positioned at the four corners of the top plate. Applying downward force at locations near the corners of the assembly presents a major drawback. As the corners of the top plate are pressed down (e.g., by a retention device), the edges of top plate between the corners (the regions that join pairs of corners together) bend in the upwards direction, as further illustrated in FIG. 1B. The result is non-uniform contact pressure. The central portions of the edges may be unable to apply a pressure distribution necessary for the underlying processor contacts to reliably electrically contact the socket.

Figure 2:
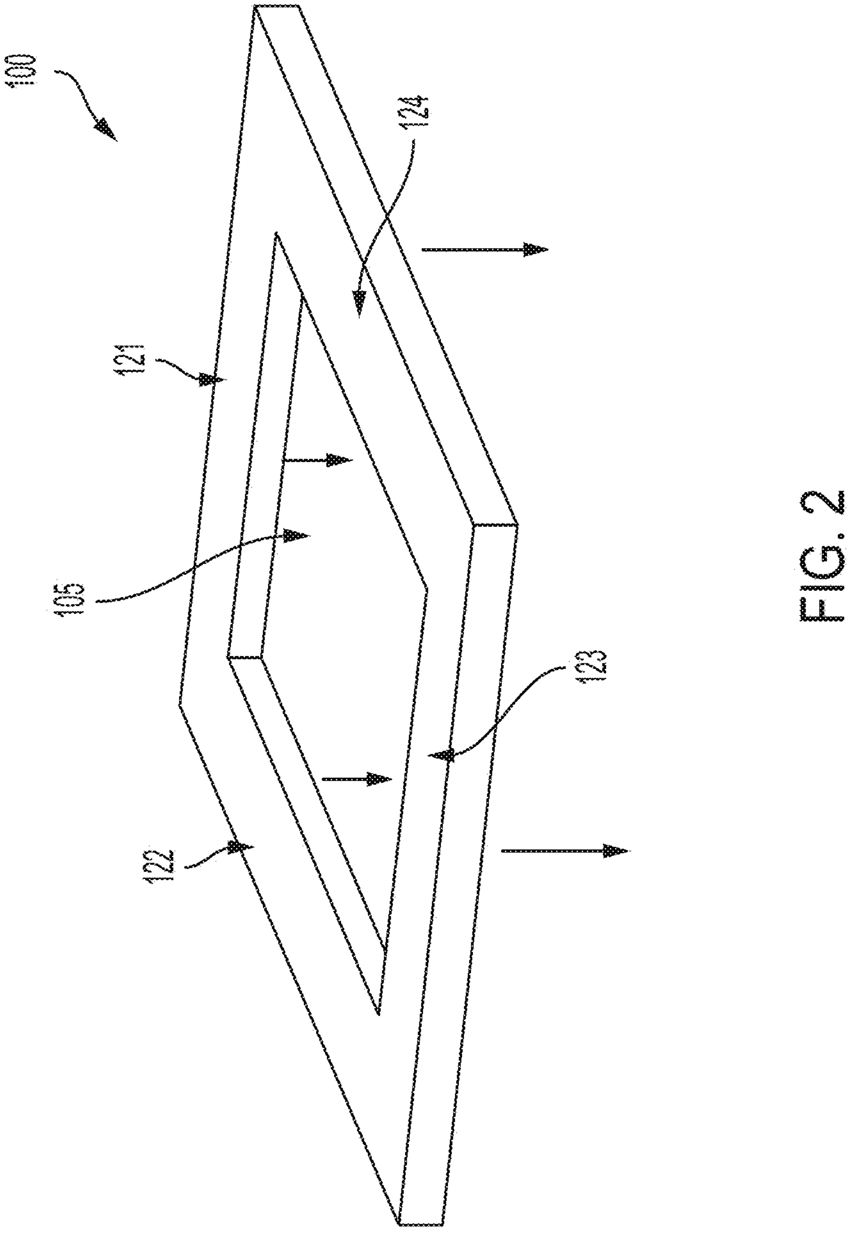
FIG. 2 is a schematic representation of a complaint pressure lid, in accordance with embodiments.

Designs as described herein move the regions of high pressure away from the corners of the assembly. For example, in some embodiments, the assembly may be designed to move the regions of high pressure away from the corners. FIG. 2 is a schematic representation of an inner portion of a compliant lid used to exert force primarily away from the corners. The force may be coupled to the inner portion of the compliant lid predominately near the central portions of the segments joining the corners. In the illustrated example, complaint lid 100 comprises first segment 121, second segment 122, third segment 123 and fourth segment 124. The segments surround a central opening 105 so that the first segment 121 is opposite the third segment 123 and the second segment 122 is opposite the fourth segment 124. Central opening 105 is shaped to permit thermal contact between a heat sink and the processor. As shown, when force is applied on the lid (e.g., using a retention device or tightening screws or coupled through linkages to an outer portion to which force is applied) forces pointing in the downward direction (towards the processor) are coupled through the central portions of the segments, as opposed to being applied predominantly from the corners as described in connection with FIG. 1B. In some embodiments, the pressure applied in the downward direction in correspondence with the midpoint of a segment (e.g., a point that is equidistant with respect to both of the corners joined by the segment and/or within +/−20% of the length of the segment from the midpoint) is larger than the pressure applied in the downward direction in correspondence with either one of the adjacent corners. Accordingly, the segments of the inner portion of less likely to flex than in the example of FIG. 1B and pressure applied to a processor via the inner portion may be more uniform.

In some examples, the force applied at the midpoint of the first segments may be at least 75% of the force applied at the first corner. In some examples, the force applied at the midpoint of the segments may be larger than the force applied at the first corner. The force at the midpoint, for example, may be 2 times or more larger than the force applied at the corners. By coupling force to the inner portion, which is in contact with the processor in the socket, pressure across the contact field may be more uniform relative to what can be achieved where force is coupled at the corners.

Figure 3:
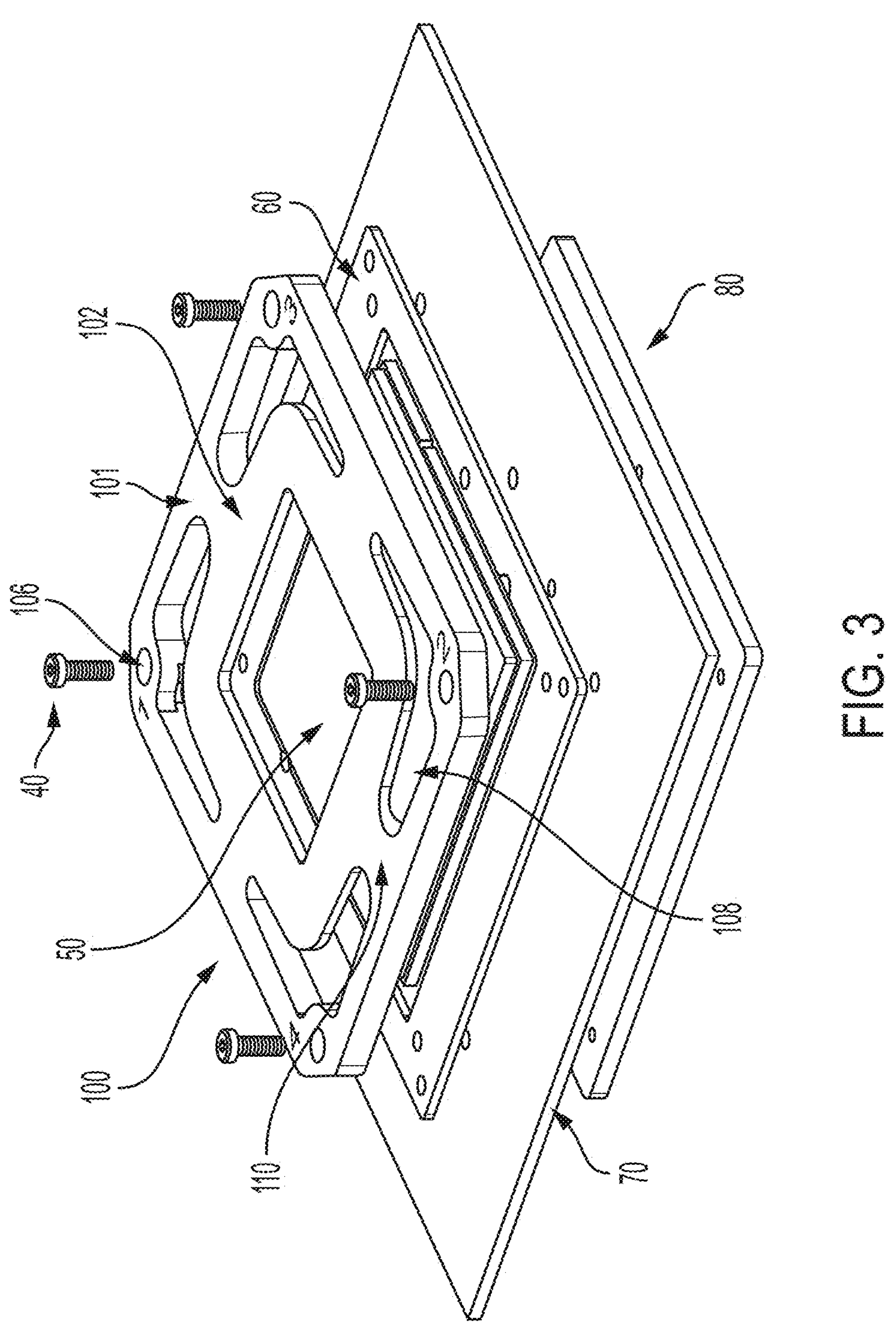
FIG. 3 is an exploded top perspective view of a processor socket assembly including a complaint pressure lid, in accordance with some embodiments.

FIG. 3 is an exploded top perspective view of a processor socket assembly including a complaint pressure lid designed to couple forces to an inner portion 102 in accordance with the diagram of FIG. 2. This assembly is similar in some respects to the assembly of FIG. 1A in that it includes a bottom plate 80, a PCB 70, a socket 60 and a processor 50. The assembly may further include a heat sink, and optionally, a device configured to apply pressure on the top surface of lid 100, although in some embodiments the heat sink itself may be the device that applies pressure to lid 100. Lid 100 replaces top plate 30 of FIG. 1A and the hardware components attached to it, such as lever 24 and retention device 20.

Processor 50 may engage with socket 60 in accordance with different configurations. For example, processor 50 may have PGA or LGA packaging and socket 60 may have contacts that are configured to mate with pins, in the case of PGA packaging, or mate with pads, in the case of LGA packaging. Regardless of the packaging type, the processor may be connected to socket 60 via a downward force that presses processor 50 into socket 60.

Socket 60 may be coupled to PCB 70, such as by soldering of contacts in the socket to PCB 70. Alternatively, socket 60 may include an interposer that makes pressure mounted contact to PCB 70, in which case the forces that press processor 50 into socket 60 may simultaneously press socket 60 into PCB 70.

Regardless of whether a downward force is used to make connections between processor 50 and socket 60 or socket 60 and PCB 70 or both, the force may be coupled to a central portion of the processor 50 and/or socket 60 via lid 100. Lid 100 comprises a central opening 105 exposing at least part of the top surface of processor 50. Opening 105 is shaped to permit thermal contact between the top surface of processor 50 and a heat sink, when one is disposed on top of lid 100. In some embodiments, opening 105 is generally shaped as a square or a rectangle, though other shapes are also possible. Opening 105 is referred to as a central opening in that it is generally positioned at or near the center of lid 100. For example, the center of the lid may fall inside opening 105.

Positioned near the corners of the lid are openings 106, which are sized to permit passage of fasteners 40 (e.g., screws, bolts, etc.). The fasteners directly or indirectly fasten the lid to PCB 70. Indirect fastening, for example, may occur as a result of fasteners 40 engaging bottom plate 80 on an opposite side of PCB 70. The region of the lid surrounding opening 105 can be viewed as including four segments (as also described in connection with FIG. 2). Each segment extends along one of the sides of the lid, from one corner to another.

Lid 100 may further comprise openings (e.g., opening 108) interrupting the continuous material, which would otherwise extend from the corner of the lid to the region where the lid engages the processor. This void of material is defined so that continual presence of material exists primarily in the region where the force delivery is preferred—in the lid segments, between adjacent corners, as discussed in connection with FIG. 2. This arrangement increases the separation between the fasteners and the regions where contact occurs, thereby allowing the lid to be more compliant in the vertical direction and to behave as a spring. In some embodiments, this is achieved through openings 108.

Openings 108 are defined around central opening 105. Each opening may extend through a portion of one of the lid segments and a portion of another one of the lid segments. For example, the first opening may be defined through a first portion of the first segment and a first portion of the second segment; the second opening may be defined through a second portion of the second segment and a first portion of the third segment; the third opening may be defined through a second portion of the third segment and a first portion of the fourth segment; and the fourth opening may be defined through a second portion of the fourth segment and a second portion of the first segment. In some embodiments, an opening defines a continuous region with no interruptions. In other embodiments, an opening may be interrupted by material. An opening may be L-shaped. For example, an opening may be located near a first corner, and may define a first region extending from the first corner to a second corner, and a second region extending from the first corner to a third corner, where the second corner is diagonally opposite the third corner.

Lid 100 comprises an inner portion 102, an outer portion 101, and bridge portions 110 joining the outer portion 101 to the inner portion 102. Inner portion 102 is proximal the central opening 105, and an outer portion 101 is distal the central opening 105. Outer portion 101 is located near the outer perimeter of lid 100, and encloses inner portion 102. The inner portion, in turn, encloses central opening 105. Each bridge portion 110 extends between a pair of adjacent openings 108.

Figure 4:
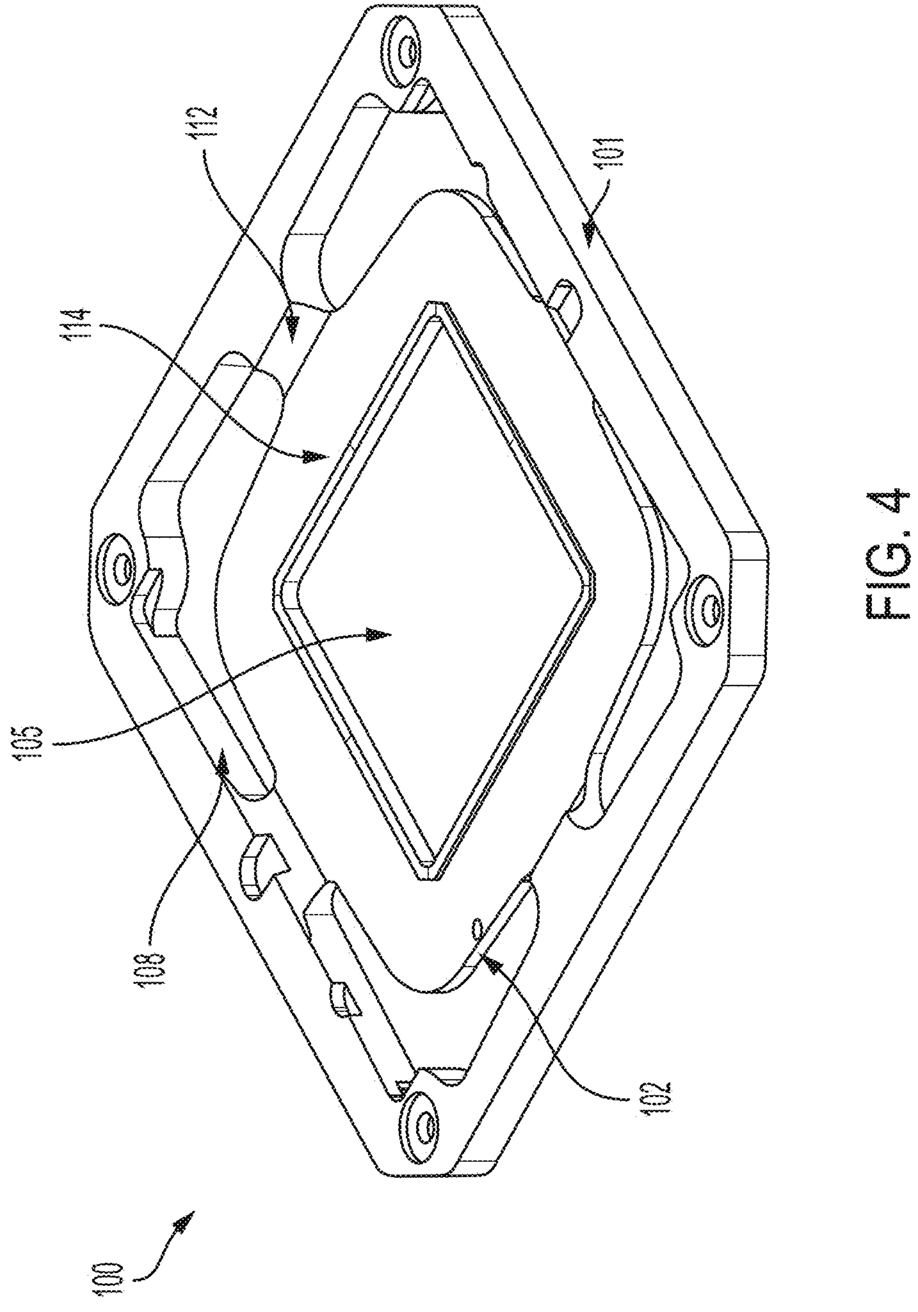
FIG. 4 is a bottom perspective view illustrating the underside of the complaint pressure lid of FIG. 3, in accordance with some embodiments.
Figure 5:
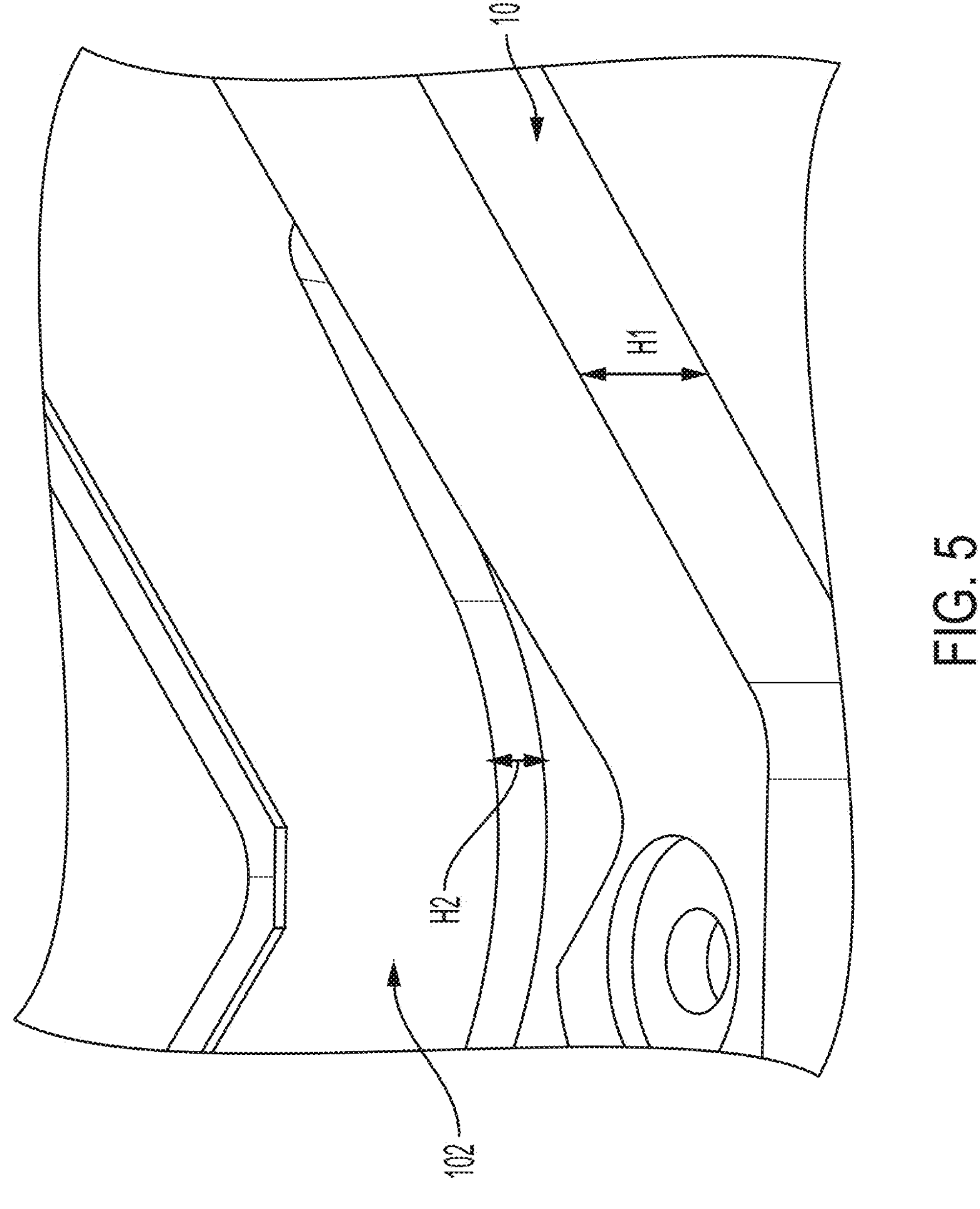
FIG. 5 is a perspective view illustrating a portion of the complaint pressure lid of FIG. 4 in additional detail, in accordance with some embodiments.

FIG. 4 is a bottom perspective view of lid 100, in accordance with some embodiments. As depicted in this figure, in some embodiments, outer portion 101 is thicker than inner portion 102. It should be noted that not all the outer portion 101 need to be thicker than the inner portion 102. For example, a sub-portion of the outer portion 101 may be thicker than a sub-portion of the inner portion 102. The sub-portions may be defined with respect to a direction parallel to the plane of lid 100. As further shown in FIG. 5, illustrating a portion of FIG. 4 in additional detail, the quantity "H1" defines the thickness of outer portion 101 along the vertical direction and the quantity "H2" defines the thickness of inner portion 102 along the same direction. H1 is greater than H2.

Further, it is not a requirement that the outer portion be thicker than the inner portion. The outer portion, for example, may be made more rigid than the inner portion by using a more rigid material. Similarly, the amount of compression of the socket assembly resulting from tighten fasteners 40 may be determined other than by the thickness of the outer portion, alone. Features of socket 60 or other members coupled to PCB 70 may cooperate with outer portion 101 to establish the height of lid 100 with respect to PCB 70 when secured.

Referring back to FIG. 4, the bottom side of bridge portions 110 may have sloped surfaces (112), which provide a transition from the thicker outer portion to the thinner inner portion. In some embodiments, the sloped surfaces 112 are formed on the bottom side of the lid 100, so that the top side of the lid can remain planar. A planar top surface ensures uniform contact with the heat sink. Increasing the thickness of the outer portions increases the force delivered to the package to the level necessary to compress the array of contacts. At the same time, the region above the processor remains thin, thus providing proper compliance. Further, the increased thickness at the outer portion of the lid may act as a mechanical stop, controlling the limit of fastening and providing repeatable seating. The high stiffness of the lid at the outer portion further maintains a load on the fastening screws, so that the screws do not become loose over time. Force maintenance is important because screws are relatively short and as a result do not tend to stretch significantly.

As further shown in FIG. 4, lid 100 further comprises a lip 114 extending from the bottom surface of the lid towards the processor. The lip is formed as part of inner portion 102, and defines a region that is thicker than the rest of inner portion 102. Lip 114 may surround central opening. In this depiction, lip 114 is defined at the perimeter of the central openings, though in some embodiments it may be defined slightly closer to outer portion 101. Lip 114 may be designed to relocate the pressure away from the edge of the lid 100 when doing so is desirable in order to balance force distribution. Lip 114 may have a constant or variable thickness beyond that of the adjacent surface so that, when compressed, the pressure plate has little or no pressure against the outer edge of the lid. The lip may be continual around the entire central opening, or there may be multiple independent lips positioned around the central opening.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Further, the specific structures and methods used illustrate inventive concepts should be regard as exemplary rather than limiting. For example, a socket was illustrated as connecting a processor to a motherboard. A socket with hardware as described herein may connect any type of component to any substrate.

As an example, of another variation, it should be appreciated by the example of FIG. 3, that the openings 108 separate the compliant lid into an inner portion 102 and an outer portion 101, joined by linkages (e.g. bridge portions 110) near the central portions of the sides of the inner portion 101. The outer portion may be relatively more rigid than the inner portion, which may exhibit compliance when pressed against a processor. The force to press processor 50 into socket 60 and/or socket 60 into PCB 70 may be generated by hardware components the force outer portion 101 towards the surface of PCB 70. This force may be coupled to inner portion 102 through the linkages at the central portions, creating the force profile described above in connection with FIG. 2. The inner and outer portions of the compliant lid as well as the linkages may be integrally formed as a single component. For example, those components may be die cast metal made in a single casting or may be milled or laser cut from a block of metal or molded of plastic in a single molding. Alternatively, the members of the compliant lid may be separately formed and then joined. The outer portion, for example, may be a more rigid die cast, and the inner portion and the linkages may be formed from one or more sheets of metal or molded of plastic.

As an example of another variation, bridge portions 110 are illustrated linking an inner portion and an outer portion of a compliant lid at central regions of the sides of both the inner portion and the outer portion. It is not a requirement that the linkages be straight or that they be coupled to the same relative locations of the outer portion and the inner portion. The linkages may be coupled to the outer portions at locations closer to a corner than the location at which the linkages are coupled to the inner portion, for example. Distances between the location at which the linkage is coupled and a corner may be compared based on absolute distances (such as might be measured in mm) or in percentages (such as might be reflected as a percentage of the length of a side).

Terms signifying direction, such as "upwards" and "downwards," were used in connection with some embodiments. These terms were used to signify direction based on the orientation of components illustrated or connection to another component, such as a surface of a printed circuit board to which a termination assembly is mounted. It should be understood that electronic components may be used in any suitable orientation. Accordingly, terms of direction should be understood to be relative, rather than fixed to a coordinate system perceived as unchanging, such as the earth's surface.

Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A processor socket assembly, comprising:

a compliant lid configured to press a processor against a socket along a vertical direction, wherein the lid comprises:

first, second, third and fourth segments surrounding a central opening so that the first segment is opposite the third segment and the second segment is opposite the fourth segment, wherein the central opening is configured to expose at least a portion of the processor, wherein:

the first segment defines an inner portion proximal the central opening, an outer portion distal the central opening, and a bridge portion joining the inner portion to the outer portion, and the inner portion has a first thickness with respect to the vertical direction, and the outer portion has a second thickness with respect to the vertical direction, wherein the second thickness is larger than the first thickness; and a first opening defined through a first portion of the first segment and a first portion of the second segment.

2. The processor socket assembly of claim 1, wherein the lid further comprises:

a second opening defined through a second portion of the second segment and a first portion of the third segment;

a third opening defined through a second portion of the third segment and a first portion of the fourth segment; and a fourth opening defined through a second portion of the fourth segment and a second portion of the first segment.

3. The processor socket assembly of claim 1, wherein the compliant lid comprises a top surface and a bottom surface opposite the top surface, wherein the bottom surface of the compliant lid is configured to apply force on the processor at the first, second, third and fourth segments along the vertical direction when the compliant lid is pressed from the top surface.

4. The processor socket assembly of claim 1, wherein the first, second, third and fourth segments are compliant with respect to the vertical direction.

5. The processor socket assembly of claim 1, wherein the first opening is L-shaped.

6. The processor socket assembly of claim 1, wherein:

the first segment joins a first corner of the compliant lid to a second corner of the compliant lid, the second segment joins the first corner of the compliant lid to a third corner of the compliant lid, the second and third corners being diagonally opposite to each other, and the first opening is adjacent to the first corner and has a first region extending towards the second corner and a second region extending towards the third corner.

7. The processor socket assembly of claim 1, wherein the compliant lid further comprises a fastener opening in a region where the first segment joins the second segment, the fastener opening being shaped to permit passage of a fastener therethrough.

8. The processor socket assembly of claim 1, wherein the bridge portion has a sloped surface facing the processor when the lid presses the processor against the socket.

9. The processor socket assembly of claim 1, wherein the lid further comprises a lip extending towards the processor when the lid presses the processor against the socket.

10. The processor socket assembly of claim 9, wherein the lip surrounds the central opening.

11. A processor socket assembly, comprising:

a compliant lid configured to press a processor against a socket along a vertical direction, wherein the lid comprises:

a top surface and a bottom surface opposite the top surface, wherein the top surface is planar and is configured to face away from the processor, and wherein the bottom surface is configured to face the processor; and first, second, third and fourth segments surrounding a central opening so that the first segment is opposite the third segment and the second segment is opposite the fourth segment, wherein the central opening is configured to expose at least a portion of the processor and wherein the first segment joins a first corner of the compliant lid to a second corner of the compliant lid, wherein the first, second, third and fourth segments define a continuous outer perimeter of the compliant lid, and wherein the compliant lid defines a first enclosed opening positioned in part in the first segment and in part in the second segment.

12. The processor socket assembly of claim 11, wherein the compliant lid defines a second enclosed opening positioned in part in the second segment and in part in the third segment.

13. The processor socket assembly of claim 12, wherein the compliant lid defines a third enclosed opening positioned in part in the third segment and in part in the fourth segment.

14. The processor socket assembly of claim 13, wherein the compliant lid defines a fourth enclosed opening positioned in part in the fourth segment and in part in the first segment.

15. The processor socket assembly of claim 11, wherein the top surface defines a plane, and wherein the first, second, third and fourth segments define the continuous outer perimeter in the plane.

16. The processor socket assembly of claim 15, wherein the first corner joins the first segment to the second segment.

17. The processor socket assembly of claim 11, wherein the compliant lid further comprises a fastener opening defined in the first corner, the fastener opening being shaped to permit passage of a fastener therethrough.

18. A method for engaging a processor to a socket using a compliant lid comprising top and bottom surfaces, first, second, third and fourth corners, and first, second, third and fourth segments surrounding a central opening, the first segment joining the first corner to the second corner, the second segment joining the second corner to the third corner, the third segment joining the third corner to the fourth corner and the fourth segment joining the fourth corner to the first corner, the method comprising:

placing the processor on the socket;

placing the compliant lid on the processor so that:

the processor is sandwiched between the socket and the compliant lid, the bottom surface of the compliant lid faces the processor, and the top surface of the compliant lid faces away from the processor, wherein the top surface defines a plane;

causing the bottom surface of the compliant lid to press against the processor so that force applied at a midpoint of the first segment is larger than force applied at the first corner, wherein causing the bottom surface of the compliant lid to press against the processor comprises applying force on the top surface of the compliant lid, wherein the first, second, third and fourth segments define a continuous outer perimeter of the compliant lid in the plane.

19. The method of claim 18, wherein the force applied at the midpoint of the first segment is larger than the force applied at the first corner by at least 75%.

20. The method of claim 18, wherein the force applied at the midpoint of the first segment is at least twice the force applied at the first corner.

21. The method of claim 18, wherein applying force on the top surface of the compliant lid comprises pressing a heat sink on the top surface of the compliant lid.

22. The method of claim 18, further comprising securing the compliant lid to a printed circuit board (PCB) on which the socket is mounted using a plurality of fasteners.

23. The method of claim 22, wherein securing the compliant lid to the PCB comprises engaging the fasteners with the first, second, third and fourth corners of the compliant lid.

24. The method of claim 18, wherein the compliant lid defines a first enclosed opening positioned in part in the first segment and in part in the second segment.

25. The method of claim 24, wherein the compliant lid defines a second enclosed opening positioned in part in the second segment and in part in the third segment.

* * * * *